(12) United States Patent
Matsushita

(10) Patent No.: US 8,159,654 B2
(45) Date of Patent: Apr. 17, 2012

(54) PRESSURE BODY AND PELLICLE MOUNTING APPARATUS

(75) Inventor: Takeshi Matsushita, Kyoto (JP)

(73) Assignee: Matsushita Seiki Co., Ltd., Kyoto-shi (JP)

( * ) Notice: Subject to any disclaimer, the term of this patent is extended or adjusted under 35 U.S.C. 154(b) by 497 days.

(21) Appl. No.: 12/477,780

(22) Filed: Jun. 3, 2009

(65) Prior Publication Data

US 2010/0310973 A1    Dec. 9, 2010

(51) Int. Cl.
*G03B 27/62* (2006.01)

(52) U.S. Cl. ........... 355/76; 355/30; 355/75; 378/35; 430/5

(58) Field of Classification Search ........ 355/30, 355/50, 52, 53, 75, 76; 378/35; 430/5
See application file for complete search history.

(56) References Cited

U.S. PATENT DOCUMENTS

| | | | |
|---|---|---|---|
| 5,397,665 A * | 3/1995 | Tabuchi et al. | 430/5 |
| 6,515,736 B1 * | 2/2003 | Hayden et al. | 355/75 |
| 6,862,817 B1 * | 3/2005 | Lenox | 33/623 |
| 6,906,783 B2 * | 6/2005 | del Puerto et al. | 355/53 |
| 6,911,283 B1 * | 6/2005 | Gordon et al. | 430/5 |
| 7,136,151 B2 * | 11/2006 | Lenox et al. | 355/75 |
| 7,173,689 B2 * | 2/2007 | Laganza et al. | 355/77 |
| 7,209,220 B2 * | 4/2007 | Puerto et al. | 355/75 |
| 7,304,720 B2 * | 12/2007 | del Puerto et al. | 355/75 |
| 7,339,653 B2 * | 3/2008 | Laganza et al. | 355/75 |
| 7,830,497 B2 * | 11/2010 | del Puerto et al. | 355/77 |
| 2003/0218728 A1 * | 11/2003 | del Puerto et al. | 355/51 |
| 2003/0227605 A1 * | 12/2003 | del Puerto et al. | 355/51 |
| 2005/0168718 A1 * | 8/2005 | Lenox | 355/75 |
| 2006/0087639 A1 * | 4/2006 | Puerto et al. | 355/75 |
| 2006/0146312 A1 * | 7/2006 | Hagiwara et al. | 355/72 |
| 2006/0187440 A1 * | 8/2006 | Lin | 355/75 |
| 2007/0127000 A1 * | 6/2007 | Laganza et al. | 355/30 |
| 2007/0258061 A1 * | 11/2007 | Puerto et al. | 355/30 |
| 2008/0213679 A1 * | 9/2008 | Miyakawa et al. | 430/5 |
| 2009/0073415 A1 * | 3/2009 | Lee et al. | 355/75 |
| 2011/0001955 A1 * | 1/2011 | Puerto et al. | 355/74 |

FOREIGN PATENT DOCUMENTS

JP    09-146261    6/1997

* cited by examiner

*Primary Examiner* — Edward Glick
*Assistant Examiner* — Thomas R Artman
(74) *Attorney, Agent, or Firm* — Crowell & Moring LLP

(57) ABSTRACT

A pressure body comprises: three or more pressure pins 40 that come into contact with a photomask 70 at downward positions in a pressure direction D; a main body 10 provided with an opening 16, the opening 16 supporting the pressure pins 40 so as to prevent the pins from dropping off downward, the opening 16 being able to change positions within a plane perpendicular to the pressure direction D, the pressure pins 40 being supported at said positions; a cover body 20 fixed to the main body 10 at an upward position in the pressure direction D; and a buffer member 30 located between the pressure pins 40 and the cover body 20 in the pressure direction D. The pressure body further comprises a cap pin 60, the cap pin 60 supported in the opening 16 so as to be prevented from dropping off downward, the cap pin 60 located in alignment with the pressure pins 40 so as to close off the opening 16, thereby preventing the buffer member 30 from being exposed downward.

9 Claims, 14 Drawing Sheets

PRESSURE BODY AND PELLICLE MOUNTING APPARATUS

BACKGROUND OF THE INVENTION

1. Field of the Invention

The present invention relates to an application apparatus for mounting, to a photomask, a pellicle assembly including a pellicle film and a support frame, and to a pressure body for pressurizing the photomask and the pellicle assembly in the application apparatus.

2. Description of Related Art

Conventionally, a pellicle mounting apparatus for mounting a pellicle assembly to a photomask has been known. An example of such a pellicle mounting apparatus is described in Patent document 1.

FIG. 13 is a perspective view illustrating a photomask 70 and a pellicle assembly 80. The photomask 70 is an original plate for forming, using optical transfer, an inner circuit of an electronic component such as a semiconductor device or flat-panel display. One of surfaces of the photomask 70 is a chromium surface (pattern surface) 71, and at the chromium surface 71, there is formed an exposure pattern region 71a in which a circuit pattern is defined. The other surface of the photomask 70 is generally called a glass surface 72.

The pellicle assembly 80 means a pellicle film provided with a frame, and includes a pellicle film 81 and a pellicle frame 82. The pellicle film 81 is placed onto a lower surface of the pellicle frame 82. The pellicle assembly 80 is used in order to fix the pellicle film 81 to the photomask 70. The pellicle assembly 80 fixed to the photomask 70 protects the chromium surface 71 from dust.

The pellicle mounting apparatus sandwiches the photomask 70 and the pellicle assembly 80, and presses them to each other. In this case, the pellicle frame 82 is provided, at its upper surface, with an adhesive layer 90. Therefore, the photomask 70 and the pellicle assembly 80 are pressurized, thereby mounting the pellicle assembly 80 to the photomask 70.

Currently, the dominating photomask for semiconductor is formed into a square whose sides are each 152 mm (6 inch) long, and whose thickness is about 6.3 mm. This photomask is generally called a "6-inch mask" or "6025" photomask. In the case of the 6-inch photomask, a pellicle assembly is mounted to a chromium surface so that a pellicle film covers an exposure pattern region of the chromium surface.

Depending on a semiconductor fabrication process, another photomask for semiconductor may also be used. This photomask for semiconductor is formed into a square whose sides are each 126.6 mm (5 inch) long, and whose thickness is about 2.3 mm. In the case of the 5-inch photomask, a pellicle assembly may be mounted to a chromium surface, or a pellicle assembly may be mounted to both of a chromium surface and a glass surface.

In a pellicle mounting apparatus, the positions of a photomask when a pellicle assembly is mounted to the photomask generally include the following two positions. In a first position, the photomask is held horizontally, and a chromium surface is facing downward. In a second position, the photomask is held perpendicularly, and the chromium surface is facing horizontally. Naturally, the position of the pellicle assembly to be mounted to the photomask is also set to correspond to the position of the photomask.

FIG. 14 is a front view illustrating principal parts of a conventional pellicle mounting apparatus 1. The pellicle mounting apparatus 1 is a horizontal type. In the pellicle mounting apparatus 1, a photomask 70 is held horizontally.

The pellicle mounting apparatus 1 includes, from the bottom to the top, a lower air cylinder 2, a lower base member 3, a pellicle pressure body 4, a mask pressure body 5, and an upper base member 6. Between the pellicle pressure body 4 and the mask pressure body 5, a pellicle assembly 80 and the photomask 70 are located at lower and upper positions, respectively. In this case, the pellicle assembly 80 is placed on the pellicle pressure body 4, and the photomask 70 is placed on a frame-like stage (not illustrated) for supporting the photomask 70.

In the pellicle mounting apparatus 1, the pellicle pressure body 4 is moved upward by driving of the lower air cylinder 2. The pellicle pressure body 4 rises while pushing up the photomask 70 via the pellicle assembly 80. The pellicle pressure body 4 and the mask pressure body 5 constitute a pair of indenters, and the photomask 70 and pellicle assembly 80 located therebetween are pressurized. As a result, the pellicle assembly 80 is mounted to the photomask 70 via the adhesive layer 90.

The pellicle mounting apparatus 1 is formed so as to be capable of coping with changes in sizes of the pellicle assembly 80 and photomask 70. Specifically, in accordance with different sizes of the pellicle assembly 80 and photomask 70, the pellicle pressure bodies 4 and mask pressure bodies 5 of different sizes are prepared. Further, so as to be able to replace the pellicle pressure body 4 in accordance with the pellicle assembly 80, the pellicle pressure body 4 is attachable and detachable to and from the lower base member 3. So as to be able to replace the mask pressure body 5 in accordance with the photomask 70, the mask pressure body 5 is attachable and detachable to and from the upper base member 6.

The pellicle pressure body 4 and the mask pressure body 5 are molded products produced by performing machining on metal (hard aluminum) or engineering plastic. The pellicle pressure body 4 has a projected portion 4a that is brought into contact with only a pellicle frame 82 of the pellicle assembly 80, thus pressurizing only the pellicle frame 82. The mask pressure body 5 has a projected portion 5a that is brought into contact with only an outer peripheral portion of the photomask 70, thus pressurizing only the outer peripheral portion of the photomask 70. In this case, the outer peripheral portion refers to a region of a glass surface 72, which is located outwardly of a patter region 71a on a chromium surface 71. It should be noted that pressurization of the photomask 70 includes not only a case in which the outer peripheral portion of the glass surface 72 is pressurized, but also a case in which an inner region of the glass surface 72 (i.e., a region of the glass surface 72, corresponding to the pellicle frame 82) is pressurized.

Patent document 1: Japanese Laid-Open Patent Publication No. 9-146261

SUMMARY OF THE INVENTION

Miniaturization of a semiconductor device, which is an integrated circuit, is advancing year after year. Therefore, miniaturization of an exposure pattern of a photomask for semiconductor, used in a semiconductor fabrication process (e.g., exposure process), is also advancing to the greatest extent possible. In a semiconductor fabrication process (e.g., exposure process) in the conventional case, irradiation light, passed through the exposure pattern region 71a of the photomask 70, forms an image over a silicon wafer via a lens. Hence, the miniaturization of the exposure pattern means a reduction in the acceptable range of deviation of an image formation position.

Upon fixation of the pellicle assembly 80 to the photomask 70 via the adhesive layer 90, a minute strain occurs in the photomask 70. The strain in the exposure pattern region 71*a* unfavorably changes the image formation position in the exposure process.

Such a strain occurs because the elastic adhesive layer 90 receives a pressure load that is nonuniform in a plane direction during a pressure process. How this strain occurs will be described in detail below.

The adhesive layer 90 is generally formed by applying a thermoplastic resin adhesive onto an upper surface of the pellicle frame 82. In other words, at ordinary temperatures, the adhesive layer 90 has elasticity without exhibiting plasticity. Therefore, in a pressure process, the adhesive layer 90, which has received a pressure load, is elastically deformed without being plastically deformed.

For the pellicle mounting apparatus 1, machining accuracy and assembly accuracy are taken into consideration so that the photomask 70 and the pellicle film 81 are as close to parallel to each other as possible. For example, the machining accuracy for the pellicle pressure body 4 and mask pressure body 5 is maintained such that the flatness of a pellicle pressure plane P4 becomes 5 μm or less and the flatness of a mask pressure plane P5 becomes 5 μm or less. Further, the assembly accuracy for the respective components, constituting the pellicle mounting apparatus 1, is maintained such that the parallelism between the pellicle pressure plane P4 and the mask pressure plane P5 becomes 10 μm or less. In this case, the pellicle pressure plane P4 refers to a plane of the pellicle pressure body 4 (i.e., an upper surface of the projected portion), which will be brought into contact with the pellicle frame 82, while the mask pressure plane P5 refers to a plane of the mask pressure body 5 (i.e., a lower surface of the projected portion), which will be brought into contact with the photomask 70.

Since the photomask 70 and the pellicle assembly 80 are rigid bodies, they will not be deformed by a pressure processing. Furthermore, the pellicle mounting apparatus 1 applies a pressure load greater than the elasticity exhibited by the adhesive layer 90, thereby enabling compression of the adhesive layer 90. Therefore, the parallelism between the pressure planes P4 and P5 will directly be the parallelism between both surfaces (i.e., upper and lower surfaces) of the adhesive layer 90. When the parallelism is not zero, the distance between both the surfaces of the adhesive layer 90 is nonuniform. A region having a shorter distance between both the surfaces receives a pressure load greater than that applied to a region having a longer distance between both the surfaces, thus deforming to a greater extent than the region having the longer distance between both the surfaces. As a result, the adhesive layer 90 is deformed not only in a pressure direction, but also in a plane direction. Upon end of the pressure process, the photomask 70 with the pellicle assembly 80 is taken out from the pellicle mounting apparatus 1. When the application of a pressure load is stopped, the deformation of the adhesive layer 90 in the pressure direction is eliminated, but the deformation thereof in the plane direction remains. Therefore, the adhesive layer 90 exerts elasticity in the plane direction so as to elongate or compress the chromium surface 71 of the photomask 70. Consequently, a minute strain occurs in the exposure pattern region 71*a*.

Basically, an object of the present invention is to uniformize, in a plane direction, a pressure load applied to an adhesive layer in a pressure process. A pressure load, which is uniform in the plane direction, is applied to the adhesive layer, thereby allowing the amount of deformation of the adhesive layer to be uniformized in the plane direction. The deformation amount of the adhesive layer is uniformized in the plane direction, thereby making it possible to prevent the adhesive layer to cause a stain in an exposure pattern of a photomask.

In order to bring a pressure load close to uniformity in the plane direction, for the parallelism between a pair of pressure planes, the parallelism (an actual value) during a pressure process has to be smaller than the parallelism (an initial value) resulting from machining accuracy and assembly accuracy. To achieve this, the present invention provides a pressure body that operates so as to reduce the parallelism between a pair of pressure planes when received a pressure load.

A first invention provides a pressure body for pressurizing a photomask and a pellicle assembly along a given pressure direction, the pellicle assembly comprising a pellicle film and a pellicle frame for supporting the pellicle film, the pressure body comprising: three or more contact members that come into contact with the photomask or the pellicle assembly at one side of the pressure direction; a main body provided with an opening, the opening supporting the contact members so as to prevent the contact members from dropping off to said one side, the opening being able to change positions within a plane perpendicular to the pressure direction, the contact members being supported at said positions; a cover body fixed to the main body at the other side of the pressure direction; and a buffer member located between the contact members and the cover body in the pressure direction.

According to the first invention, the buffer member is deformed in accordance with a pressure load applied between a pair of pressure bodies; therefore, the parallelism (an actual value) during a pressure process can be smaller than the parallelism (an initial value) resulting from machining accuracy and assembly accuracy. As a consequence, the pressure load applied to an adhesive layer can be brought close to uniformity in the plane direction.

Moreover, in accordance with an unbalanced pressure load in the plane direction of a pressure plane, the number and positions of the contact members located within the pressure body are appropriately adjusted, thereby enabling a further reduction in the parallelism (actual value) during the pressure process.

The first invention preferably adopts the following aspects (a) to (e).

In the aspect (a), the pressure body further comprises a cover member, the cover member supported by the opening so as to be prevented from dropping off to said one side, the cover member located in alignment with the contact members so as to close off the opening, thereby preventing the buffer member from being exposed to said one side.

According to the aspect (a), even if dust is generated from the buffer member, the dust can be prevented from being discharged through the opening to outside.

In the aspect (b) based on the aspect (a), wherein the opening is a set of four or more through holes.

In the aspect (c) based on the aspect (a), the pressure body further comprises a plurality of the cover members, wherein one of the contact members and one of the cover members each have dimensions which can close off one of the through holes.

In the aspect (d) based on the aspect (c), wherein inner surfaces of the through holes are tapered, and wherein the contact members and the cover members have tapered outer surfaces corresponding to the inner surfaces of the through holes.

According to the aspect (d), when the contact members and the cover members are moved in the pressure direction, the contact members and the cover members do not come into friction contact with the through holes. Accordingly, even if the contact members and the cover members are moved in the pressure direction, generation of dust is prevented.

In the aspect (e), the pressure body further comprises a plurality of the buffer members, wherein the respective buffer members are located at different positions along the plane.

In the aspect (f) based on the aspect (e), wherein materials for the buffer members are different depending on the positions.

According to the aspect (f), the deformation amounts of the buffer members in the pressure direction can be changed at each different location of the buffer members. Accordingly, the buffer members whose materials are different are appropriately used in accordance with an unbalanced pressure load in the plane direction of the pressure plane, thereby enabling a further reduction in the parallelism (actual value) during the pressure process.

In the aspect (g) based on the aspect (e), wherein thicknesses of the buffer members in the pressure direction are different depending on the positions.

According to the aspect (g), the deformation amounts of the buffer members in the pressure direction can be changed at each different location of the buffer members. Accordingly, the buffer members having different thicknesses are appropriately used in accordance with an unbalanced pressure load in the plane direction of the pressure plane, thereby enabling a further reduction in the parallelism (actual value) during the pressure process.

A second invention provides a pellicle mounting apparatus comprising: a pair of pressure bodies for pressurizing a photomask and a pellicle assembly along a given pressure direction, the pellicle assembly comprising a pellicle film and a pellicle frame for supporting the pellicle film; and an actuator capable of urging at least one of the pair of pressure bodies along the pressure direction, wherein at least one of the pair of pressure bodies is the pressure body according to the first invention.

DETAILED DESCRIPTION OF THE INVENTION (First Embodiment)

Figure 1:
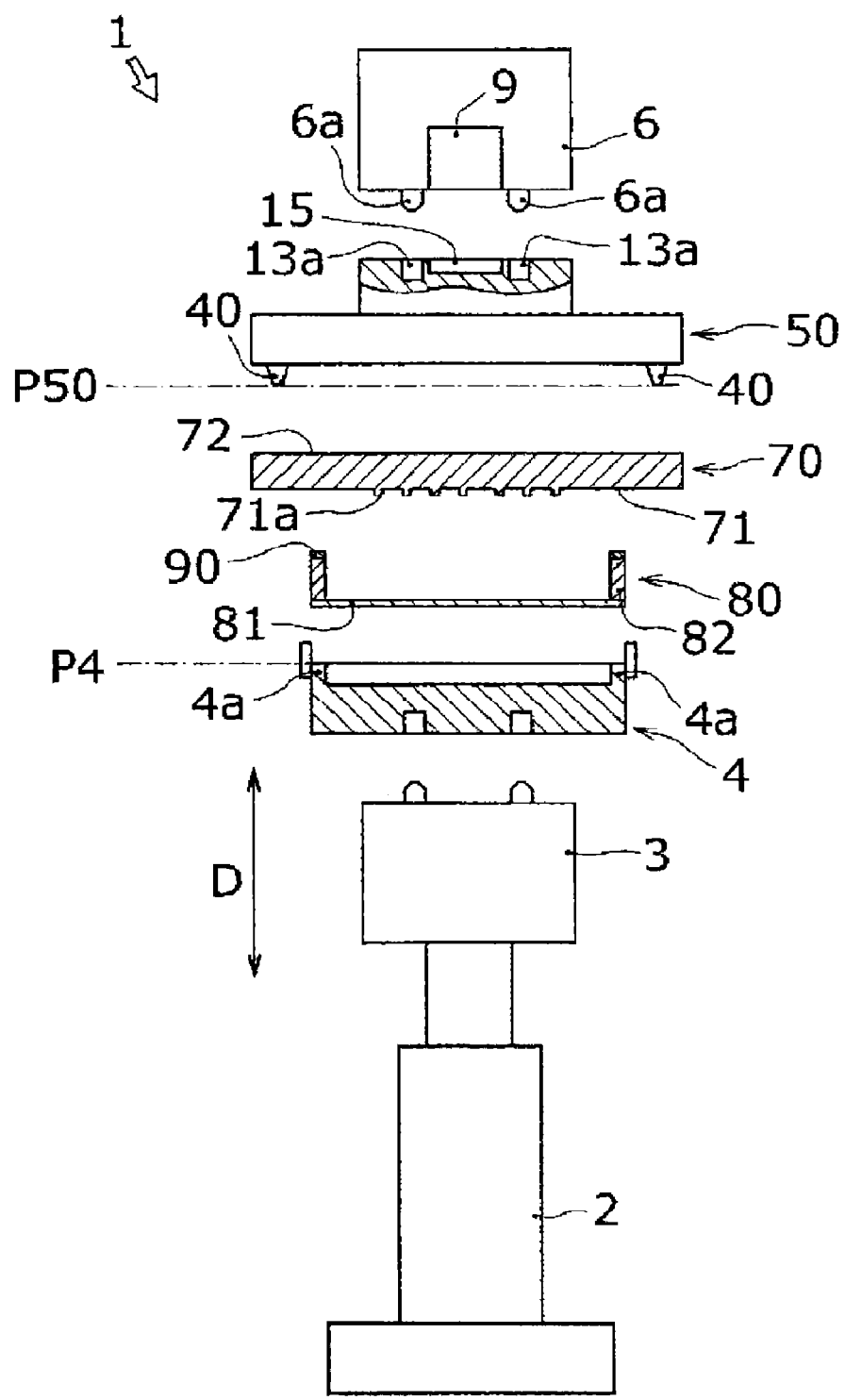
FIG. 1 shows a front view illustrating principal parts of a pellicle mounting apparatus (first embodiment).

FIG. 1 is a front view illustrating principal parts of a pellicle mounting apparatus 1 according to a first embodiment. In FIG. 1, the pellicle mounting apparatus 1 is a horizontal type. In the pellicle mounting apparatus 1, a photomask 70 is held horizontally. The pellicle mounting apparatus 1 includes, from the bottom to the top, a lower air cylinder 2, a lower base member 3, a pellicle pressure body 4, a mask pressure body 50, and an upper base member 6. The lower air cylinder 2 and the upper base member 6 are fixed to a frame (not illustrated) of the pellicle mounting apparatus 1.

Between the pellicle pressure body 4 and the mask pressure body 50, a pellicle assembly 80 and the photomask 70 are located at lower and upper positions, respectively. Here, the pellicle assembly 80 is placed on the pellicle pressure body 4, and the photomask 70 is placed on a frame-like stage (not illustrated) for supporting the photomask 70. In the photomask 70, a glass surface 72 is facing upward, while a chromium surface 71 is facing downward. At a center of the chromium surface 71, an exposure pattern region 71a is formed. The pellicle assembly 80 includes a pellicle film 81 and a pellicle frame 82. The pellicle frame 82 is provided, at its upper surface, with an adhesive layer 90.

The adhesive layer 90 is generally formed by applying a thermoplastic resin adhesive onto an upper surface of the pellicle frame 82.

In the pellicle mounting apparatus 1, the pellicle pressure body 4 is moved upward by driving of the lower air cylinder 2. The pellicle pressure body 4 rises while pushing up the photomask 70 via the pellicle assembly 80. The pellicle pressure body 4 and the mask pressure body 50 constitute a pair of indenters, and the photomask 70 and pellicle assembly 80 located therebetween are pressurized. As a result, the pellicle assembly 80 is mounted to the photomask 70 via the adhesive layer 90.

The pellicle mounting apparatus 1 is formed so as to be capable of coping with changes in sizes of the pellicle assembly 80 and photomask 70. Specifically, in accordance with different sizes of the pellicle assembly 80 and photomask 70, the pellicle pressure bodies 4 and mask pressure bodies 50 of different sizes are prepared. Further, so as to be able to replace the pellicle pressure body 4 in accordance with the pellicle assembly 80, the pellicle pressure body 4 is attachable and detachable to and from the lower base member 3. So as to be able to replace the mask pressure body 50 in accordance with the photomask 70, the mask pressure body 50 is attachable and detachable to and from the upper base member 6.

The pellicle pressure body 4 is a molded product produced by performing machining on metal (hard aluminum) or engineering plastic. The pellicle pressure body 4 has a projected portion 4a that is brought into contact with only the pellicle frame 82 of the pellicle assembly 80, thus pressurizing only the pellicle frame 82. The projected portion 4a corresponds to the shape of the pellicle frame 82, and corresponds to a rectangular frame-like portion.

Figure 2:
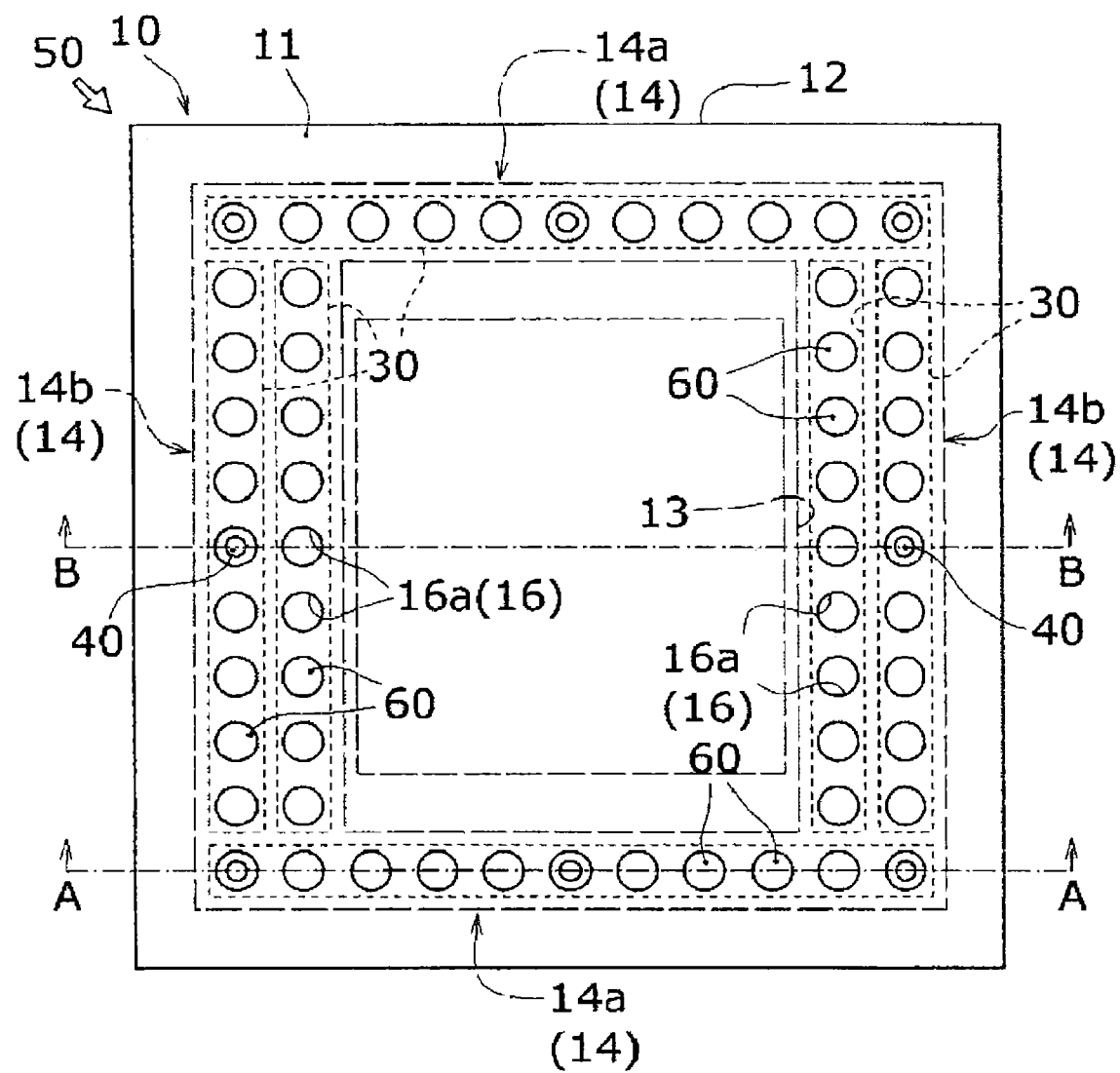
FIG. 2 shows a bottom view of a mask pressure body viewed from the bottom side thereof (first embodiment).
Figure 3:
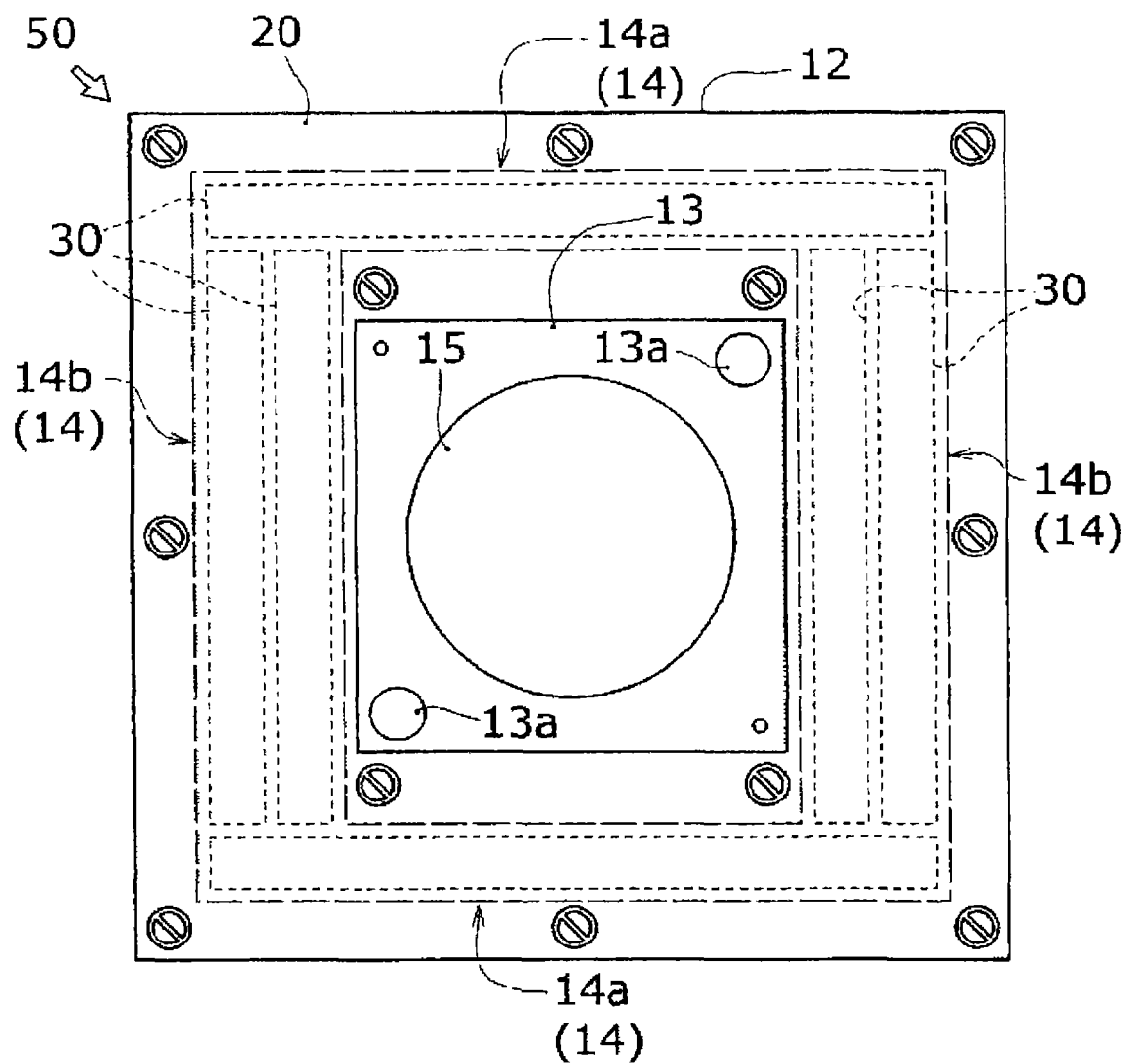
FIG. 3 shows a top view of the mask pressure body viewed from the upper side thereof (first embodiment).
Figure 4:
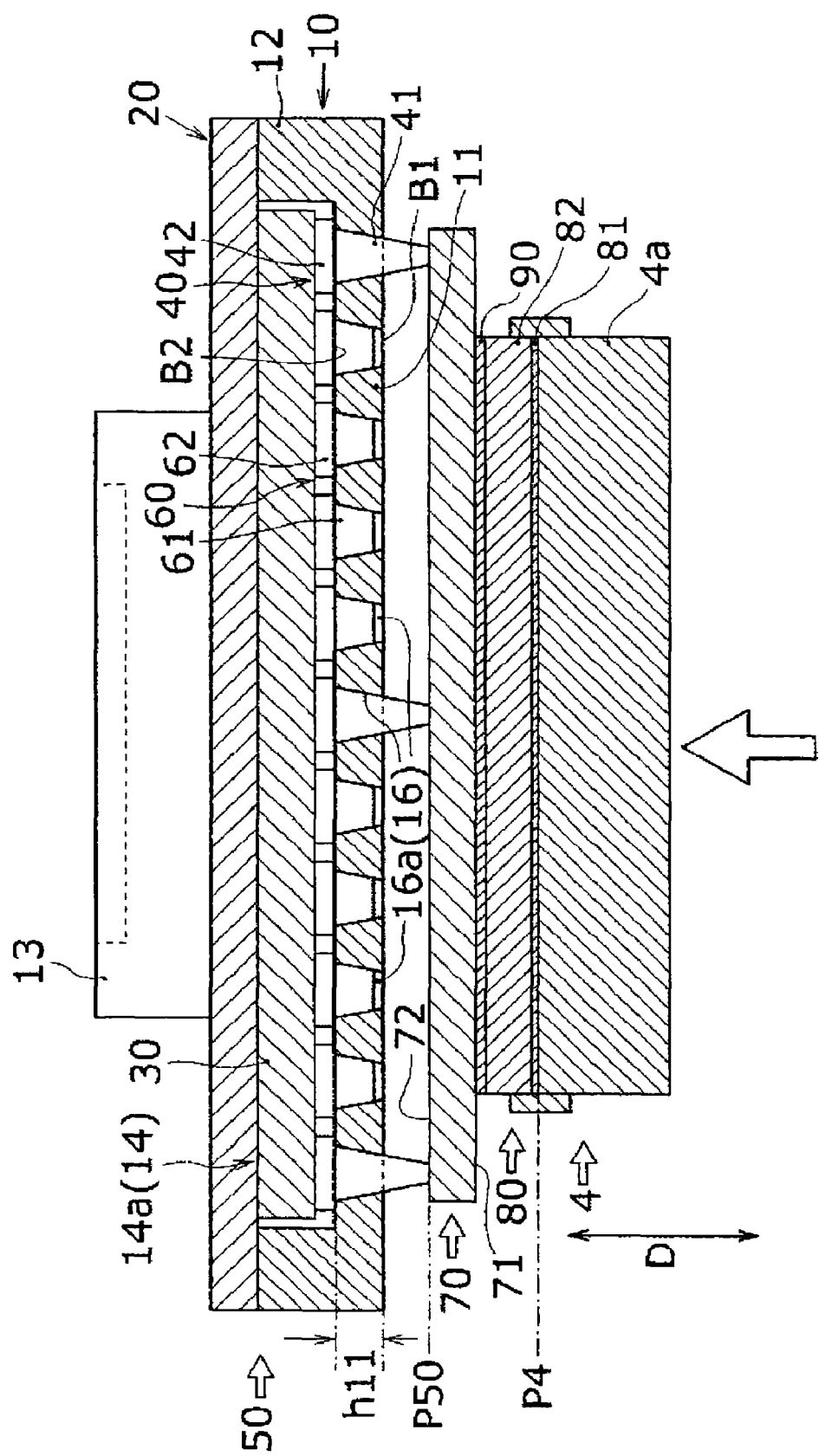
FIG. 4 shows a cross-sectional view (front cross-sectional view) taken along the line A-A of FIG. 2 (first embodiment).
Figure 5:
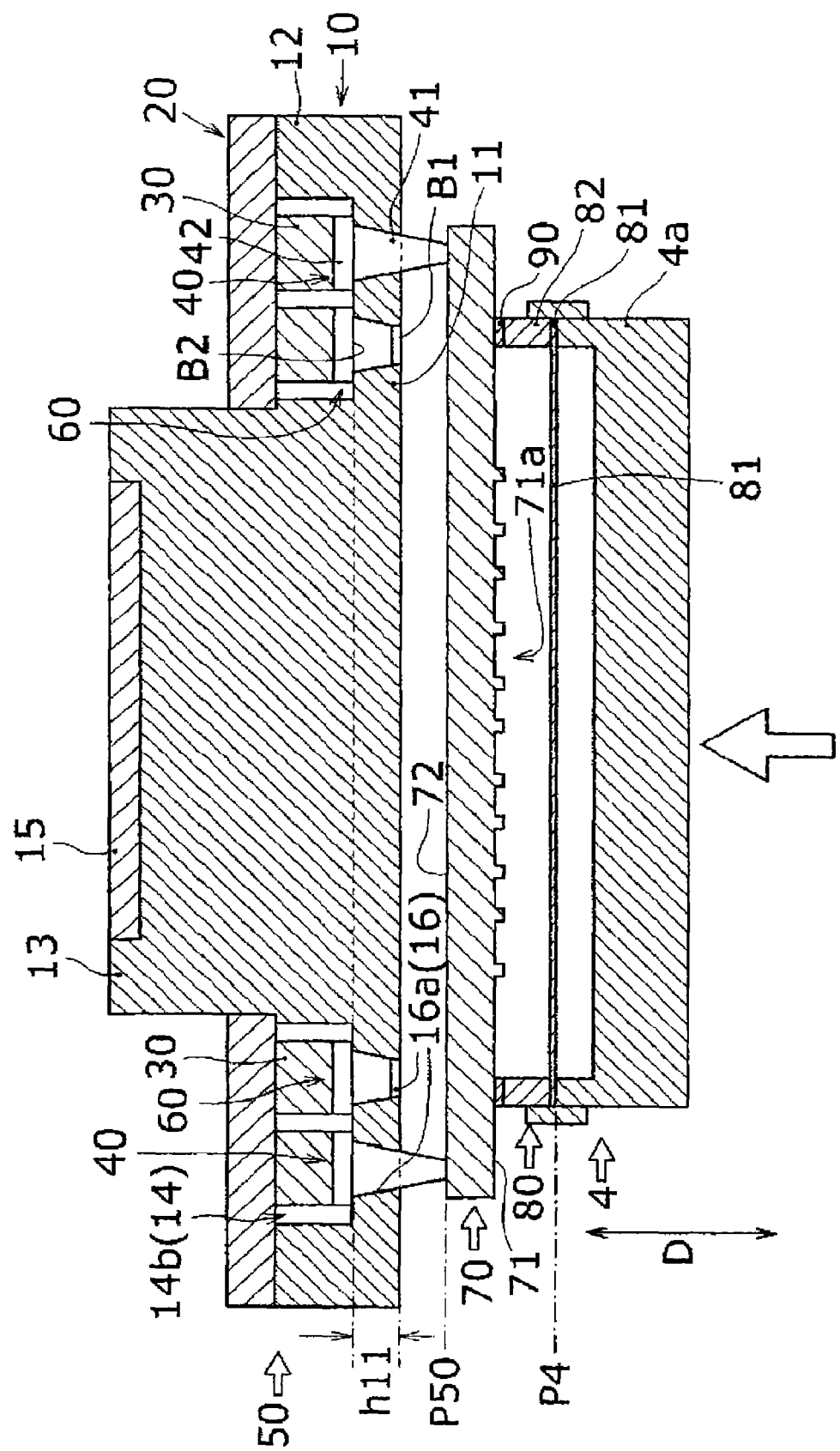
FIG. 5 shows a cross-sectional view (front cross-sectional view) taken along the line B-B of FIG. 2 (first embodiment).

The mask pressure body 50 will be described with reference to FIGS. 2 to 5. FIG. 2 is a bottom view of the mask pressure body viewed from the bottom side thereof. FIG. 3 is a top view of the mask pressure body viewed from the upper side thereof. FIG. 4 is a cross-sectional view (front cross-sectional view) taken along the line A-A of FIG. 2. FIG. 5 is a cross-sectional view (front cross-sectional view) taken along the line B-B of FIG. 2.

In FIG. 4, the mask pressure body 50 includes: a main body 10; a cover body 20; a buffer member 30; a plurality of pressure pins (contact members) 40; and a plurality of cap pins (cover members) 60. The pressure pins 40 are components that come into direct contact with the photomask 70. The buffer member 30 is a member for elastically supporting the pressure pins 40. The main body 10 and the cover body 20 support the pressure pins 40 and the buffer member 30.

In the following, the position of the mask pressure body 50 will be described with respect to the position thereof during use in the pellicle mounting apparatus 1. For example, the upper side and bottom side of the plane of FIG. 4 correspond to an actual vertical direction. Furthermore, in the present embodiment, a pressure direction D, in which the mask pressure body 50 and the pellicle pressure body 4 pressurize the photomask 70 and the pellicle assembly 80, is a vertical direction.

In FIGS. 2 to 4, the main body 10 includes: a bottom plate portion 11; a lateral plate portion 12; and a base portion 13. The bottom plate portion 11 is a plate-like portion. The shape of the bottom plate portion 11 is a rectangle close to a square within a horizontal plane. The lateral plate portion 12 is a rectangular frame-like member surrounding an outer peripheral portion of the bottom plate portion 11, and is extended upward from the bottom plate portion 11. The base portion 13 is a columnar body extended upward from a center of the bottom plate portion 11.

In FIGS. 2 to 4, a magnetic body 15 is fixed at a center of an upper surface of the base portion 13. Further, two positioning holes 13a, 13a are diagonally formed at ends of the upper surface of the base portion 13. On the other hand, in FIG. 1, the upper base member 6 for supporting the mask pressure body 50 is provided with: an electromagnet (or ferromagnetic body) 9; and two positioning pins 6a, 6a. Upon fixation of the magnetic body 15 to the electromagnet 9 with the two positioning pins 6a, 6a inserted into the two positioning holes 13a, 13a, the mask pressure body 50 is fixed to the upper base member 6.

Referring to FIGS. 2 to 4, in the main body 10, a groove 14 is formed between the lateral plate portion 12 and the base portion 13. The groove 14 is a rectangular frame-like groove. The groove 14 includes, as four side portions, first side portions 14a, 14a, and second side portions 14b, 14b. The first side portions 14a, 14a are located at front and rear positions. The second side portions 14b, 14b are located at right and left positions. The width of the second side portion 14b is about twice as large as that of the first side portion 14a.

In FIGS. 2 and 4, the bottom plate portion 11 has an opening 16. The opening 16 is a set of a large number of (four or more) through holes 16a. The through holes 16a vertically pass through the bottom plate portion 11. The through holes 16a are located along regions where the groove 14 is formed. In each region where the first side portion 14a is formed, the through holes 16a are arranged in a single row. In each region where the second side portion 14b is formed, the through holes 16a are arranged in two rows. Each through hole 16a is a conical trapezoidal hole having a lower bottom surface B1 and an upper bottom surface B2.

In FIG. 2, the pressure pins 40 are inserted into part of the through holes 16a. In FIG. 4, the pressure pins 40 are protruded downward from the bottom plate portion 11. The pressure pins 40 each include: a conical trapezoidal shaft portion 41; and a disk-like bottom portion 42. The length of the shaft portion 41 is longer than a thickness h11 of the bottom plate portion 11. The axial cross-section of each shaft portion 41 is equal to that of the lower bottom surface B1 at an intermediate portion of the shaft portion 41, and is equal to that of the upper bottom surface B2 at an upper end of the shaft portion 41. The shaft portions 41 and the through holes 16a are both tapered, and therefore, the pressure pins 40 will not drop off downward (i.e., toward one side of the pressure direction D) from the bottom plate portion 11. One of the pressure pins 40 closes off one of the through holes 16a. Further, the axial cross-section of the bottom portion 42 is wider than that of the upper bottom surface B2. The bottom portion 42 is provided in order to ensure a wide area that comes into contact with the buffer member 30. Therefore, each bottom portion 42 is set at the maximum size possible to such an extent that the adjacent pressure pins 40 will not come into contact with each other.

In FIG. 2, the cap pins 60 are inserted into part of the through holes 16a. In FIG. 4, the cap pins 60 are not protruded downward from the bottom plate portion 11. The cap pins 60 also each include: a conical trapezoidal shaft portion 61; and a disk-like bottom portion 62. The length of the shaft portion 61 is approximately equal to the thickness h11 of the bottom plate portion 11. The axial cross-section of each shaft portion 61 is equal to that of the lower bottom surface B1 at a lower end of the shaft portion 61, and is equal to that of the upper bottom surface B2 at the upper end of the shaft portion 41. The shaft portions 61 and the through holes 16a are both tapered, and therefore, the cap pins 60 will also not drop off downward (i.e., toward one side of the pressure direction D) from the bottom plate portion 11. One of the cap pins 60 closes off one of the through holes 16a. Furthermore, similarly to the bottom portion 42 of each pressure pin 40, the bottom portion 62 is also formed so as to be wider than the shaft portion 41.

In FIG. 2, the buffer members 30 are located within the groove 14 along the region in which the groove 14 is formed. Each buffer member 30 is a longitudinal plate-like parallelepiped. The single buffer member 30 is located in each region where the first side portion 14a is formed. The two buffer members 30 are located in parallel in each region where the second side portion 14b is formed. Lower surfaces of the buffer members 30 are brought into contact with the bottom portions 42 of the pressure pins 40 and the bottom portions 62 of the cap pins 60.

In FIG. 4, the cover body 20 is provided at the upper side (i.e., at the other side of the pressure direction D) of the main body 10. More specifically, the cover body 20 is fixed onto the lateral plate portion 12. In FIG. 3, the cover body 20 is a rectangular frame-like member, which is close to a square within a horizontal plane. The cover body 20 can cover the groove 14 from above. In this case, the positioning of the buffer members 30 is determined in the vertical direction by the pressure pins 40 and cap pins 60 located therebelow, and the cover body 20 located thereabove.

The structures of the opening 16 and the groove 14 will be described with reference to FIG. 2. Similarly to the conventional mask pressure body 5, the mask pressure body 50 is formed so that an outer peripheral portion of the photomask 70 in the plane direction is pressurized. Here, a portion pressurized by the mask pressure body 50 in the glass surface 72 of the photomask 70 is a backside portion corresponding to the immediate back of the pellicle frame 82, or an outside portion located outside of the backside portion. In the present embodiment, the through holes 16a of the single row within each first side portion 14a correspond to the outside portion (hereinafter, called an "approximate backside portion") close to the backside portion of the glass surface 72. The through holes 16a in the single inner row within each second side portion 14b also correspond to the backside portion of the glass surface 72. The through holes 16a in the single outer row within each second side portion 14b correspond to the outside portion of the glass surface 72.

In FIG. 2, the eight pressure pins 40 are located at the two first side portions 14a and outside regions of the two second side portions 14b. In other words, the locations of the pressure pins 40 in FIG. 2 are set so that the approximate backside portion of the pellicle frame 82 and the outside portion of the pellicle frame 82 are pressurized. The positions of the eight pressure pins 40 are vertex positions of the square and midpoint positions of the respective sides. Furthermore, in the remaining through holes 16a, the cap pins 60 are located. Thus, all the through holes 16a within the opening 16 are closed off by the pressure pins 40 and the cap pins 60.

Figure 6:
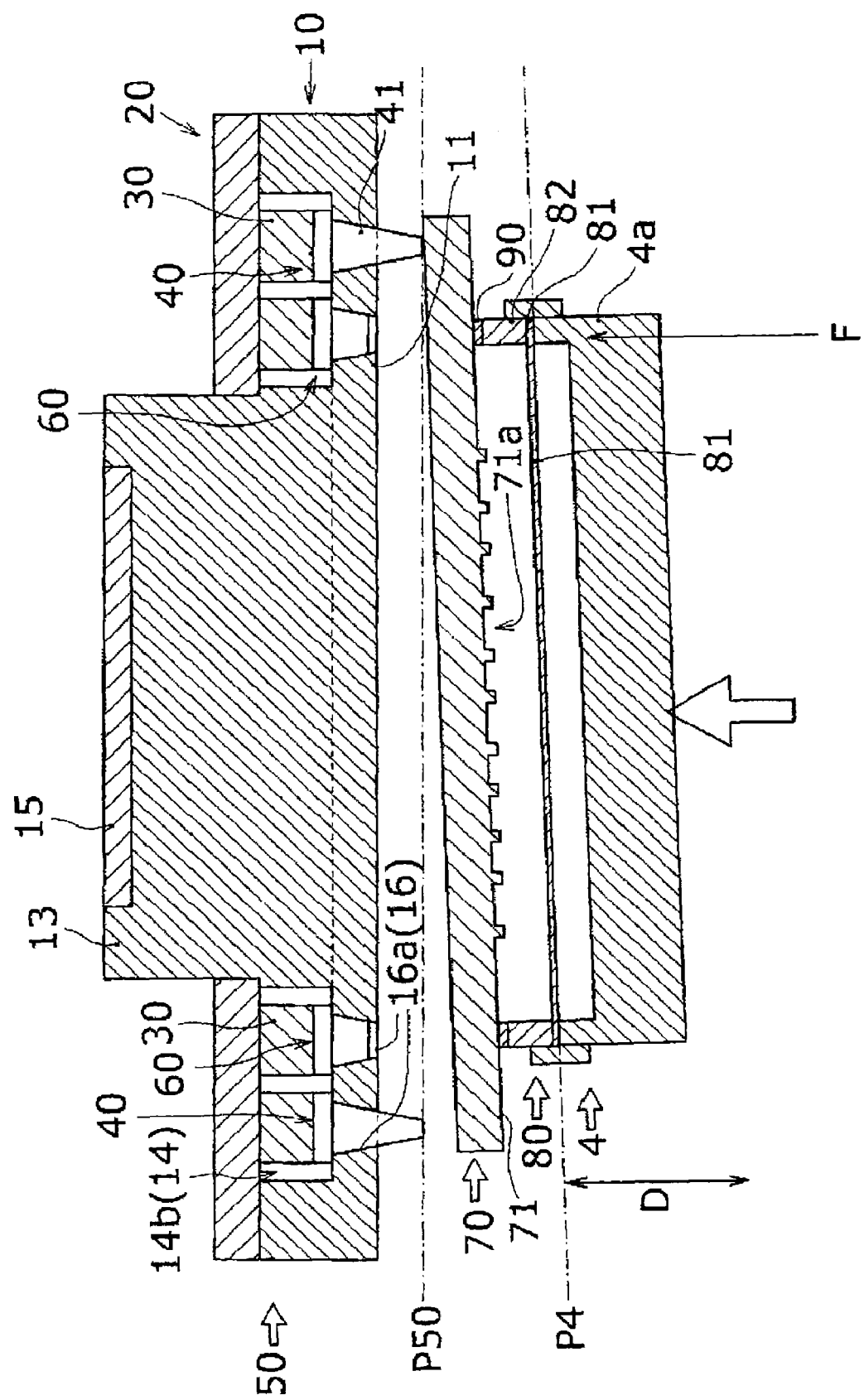
FIG. 6 shows a front cross-sectional view when the mask pressure body is viewed immediately after the start of a pressure process (first use example).
Figure 7:
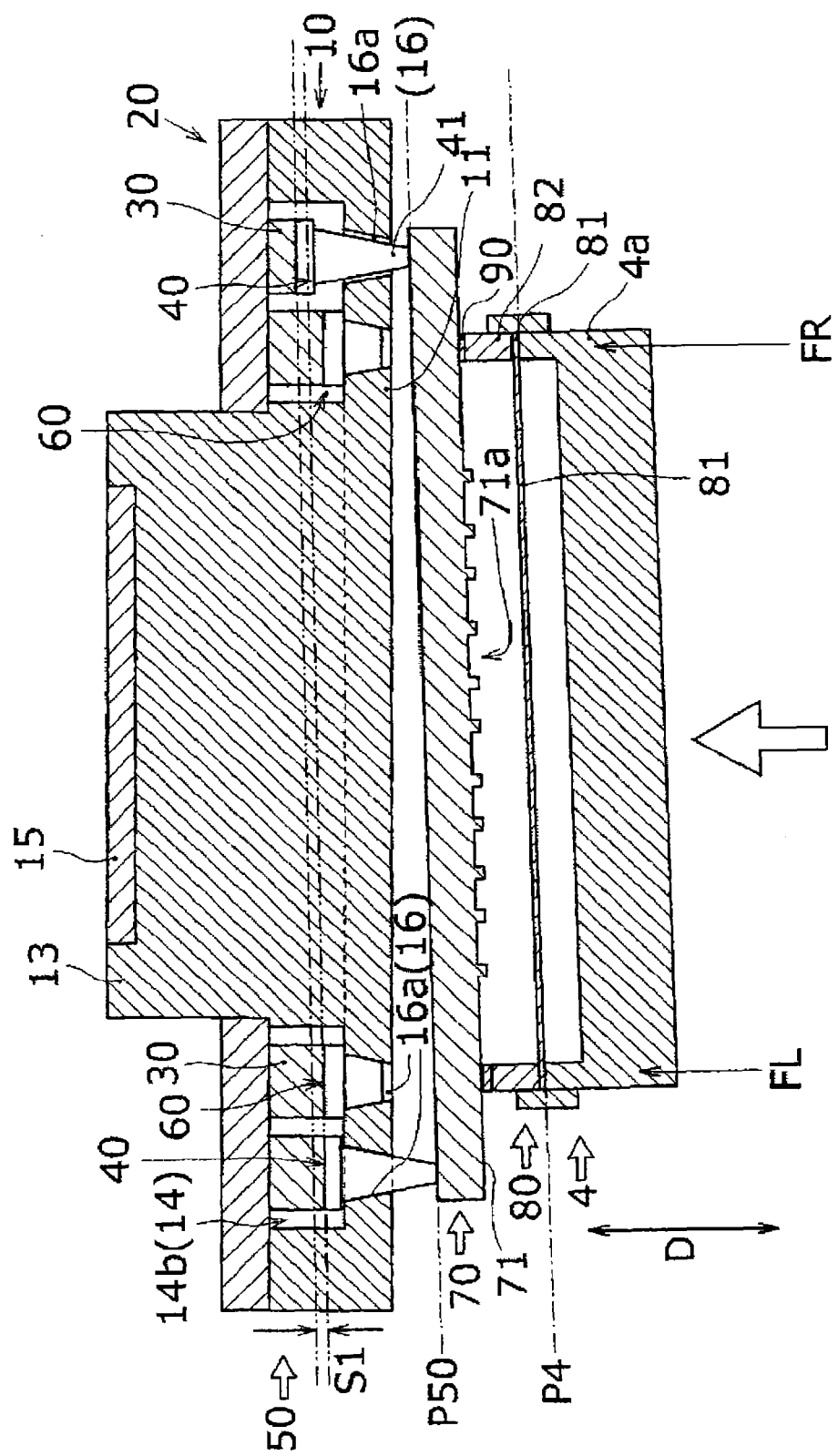
FIG. 7 shows a front cross-sectional view when the mask pressure body is viewed after the start of the pressure process (first use example).
Figure 8:
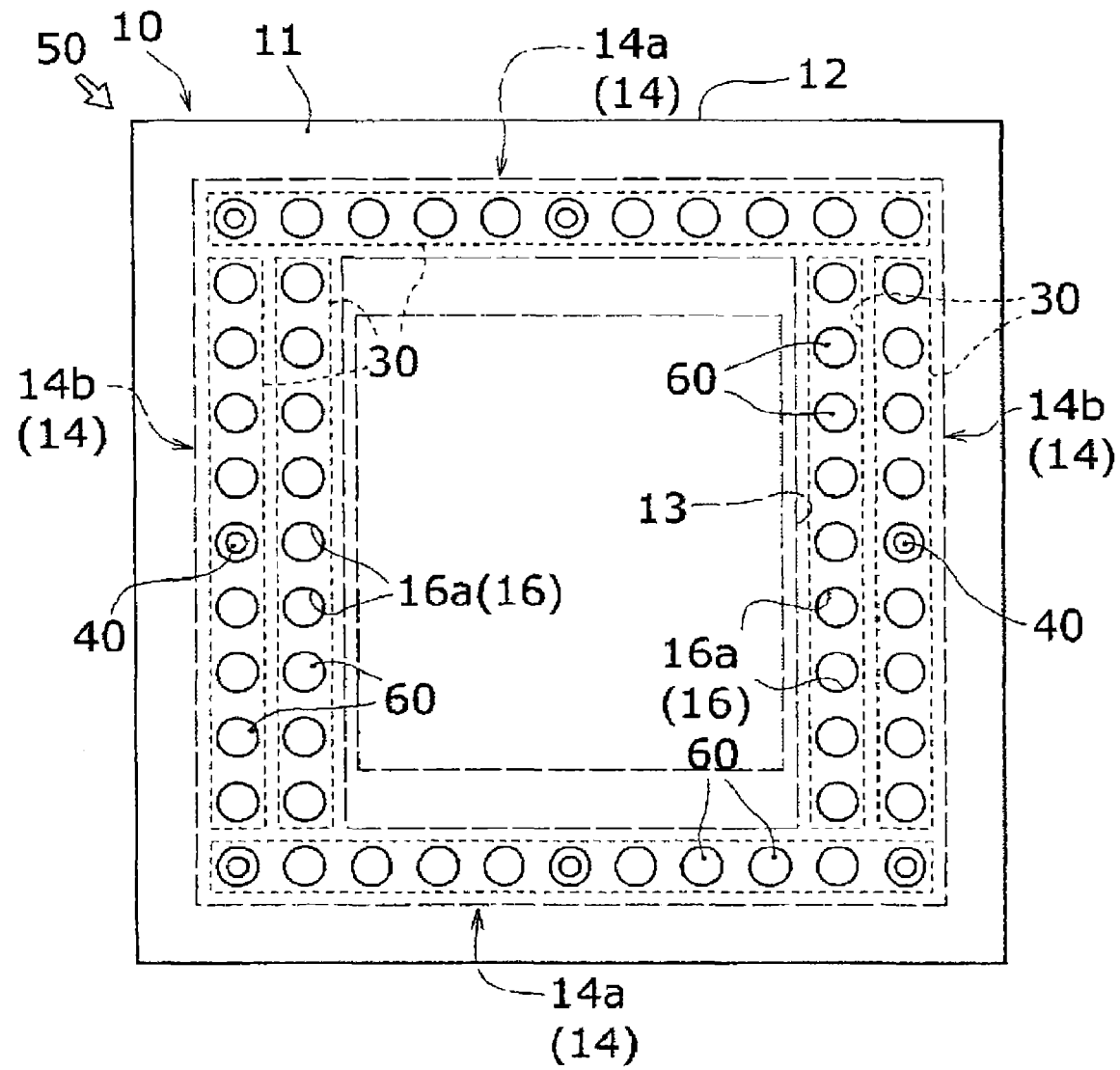
FIG. 8 shows a bottom view of the mask pressure body, viewed from the bottom side thereof (second use example).
Figure 9:
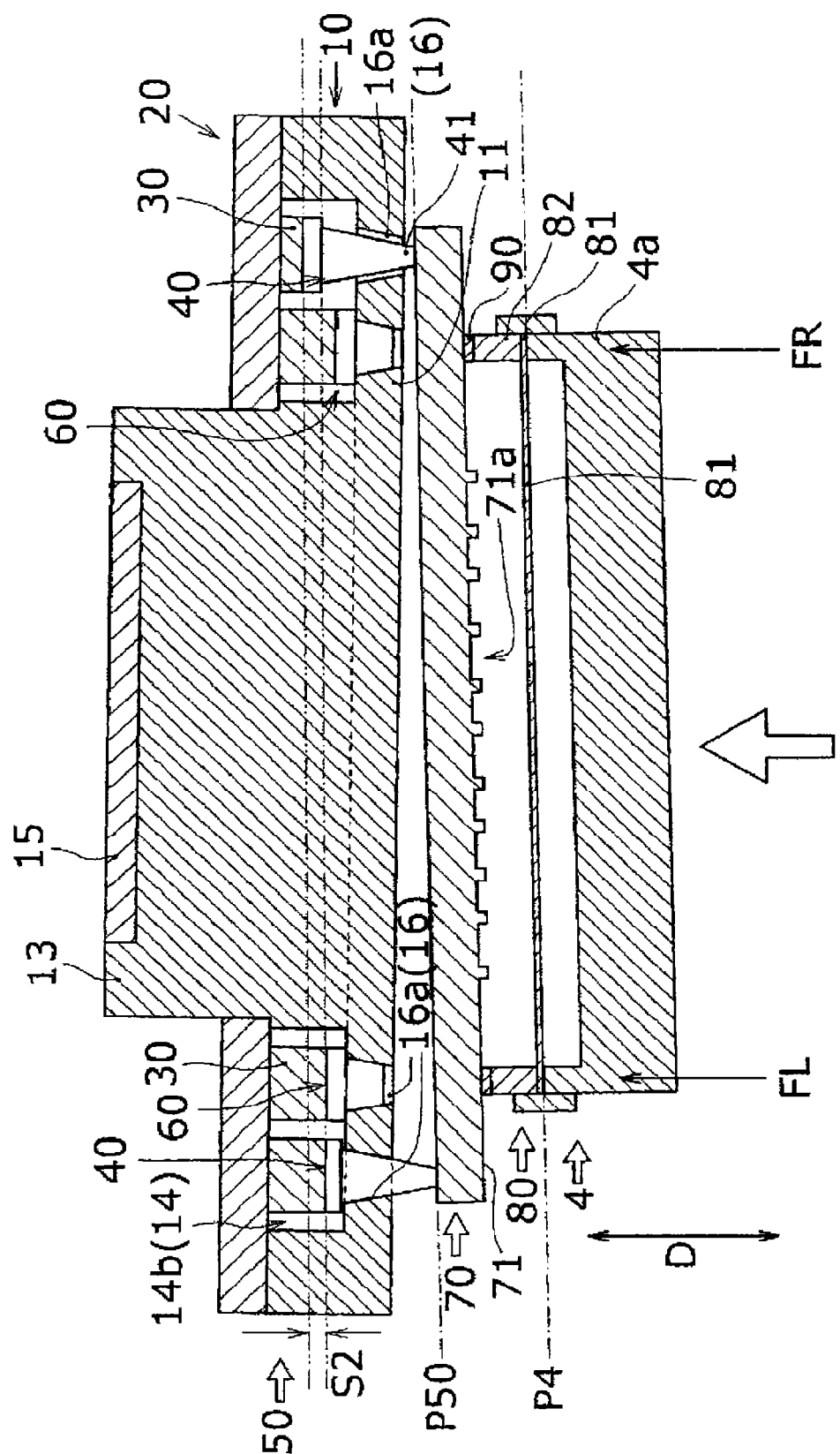
FIG. 9 shows a front cross-sectional view when the mask pressure body is viewed after the start of a pressure process (second use example).

How the mask pressure body 50 operates will be described with reference to FIGS. 6 to 9. FIGS. 6 and 7 each illustrate a first use example for the locations of the pins 40 and 60. FIGS. 8 and 9 each illustrate a second use example for the locations of the pins 40 and 60.

As described above, the mask pressure body 50 includes a plurality of the pressure pins 40 and a plurality of the cap pins 60. Therefore, the number and positions of the pressure pins 40 located within the opening 16 can be appropriately adjusted. Depending on the number and positions of the pressure pins 40 located within the opening 16, the inclination of a mask pressure plane P50 when the mask pressure body 50 receives a pressure load is changed.

The first use example represents a case in which the pressure pins 40 are located uniformly within the opening 16 as illustrated in FIG. 2.

FIG. 6 is a front cross-sectional view when the mask pressure body 50 is viewed immediately after the start of a pressure process. "Immediately after the start" refers to immediately after the photomask 70 and the pellicle assembly 80 are sandwiched between the pellicle pressure body 4 and the mask pressure body 50. In other words, subsequent to this start time point, a pressure load is applied to the adhesive layer 90 between the photomask 70 and the pellicle assembly 80.

In FIG. 6., a pellicle pressure plane P4 is rising rightward, and the mask pressure plane P50 is declining rightward. The parallelism between the pellicle pressure plane P4 and the mask pressure plane P50 is not zero due to the machining accuracy and assembly accuracy for the pellicle mounting apparatus 1. Here, the pellicle pressure plane P4 is a plane of the pellicle pressure body 4, which comes into contact with the pellicle frame 82, and refers to the upper surface of the projected portion 4a. The mask pressure plane P50 is a plane of the mask pressure body 50, which comes into contact with the photomask 70, and refers to a plane passing through a lower end position of each pressure pin 40. At the point in time illustrated in FIG. 6, only right ends of the photomask 70 and pellicle assembly 80 are sandwiched between the pellicle pressure plane P4 and the mask pressure plane P50. As a result, a pressure load F is applied only to the right ends of the photomask 70 and pellicle assembly 80.

FIG. 7 is a front cross-sectional view when the mask pressure body 50 is viewed after the start of the pressure process. The pellicle pressure body 4 rises upward from the state illustrated in FIG. 6, thereby advancing the pressure process. In this case, not only the adhesive layer 90 but also the buffer members 30 are deformable in the pressure direction D. Therefore, the pellicle pressure body 4 can be moved more upward due to the deformation of the adhesive layer 90 and buffer members 30. As a result, the entire pellicle frame 82 and photomask 70, including not only the right ends thereof but also the left ends thereof, is pressurized by the pellicle pressure body 4 and the mask pressure body 50. In FIG. 7, a pressure load FR is applied to the right side portions of the pellicle frame 82 and photomask 70, and a pressure load FL is applied to the left side portions of the pellicle frame 82 and photomask 70.

The pressure load varies in accordance with the distance between a pair of the pressure planes P4 and P50. A region, in which the distance between the pressure planes P4 and P50 is shorter, receives a pressure load greater than that applied to a region in which the distance between the pressure planes P4 and P50 is longer. Accordingly, in FIG. 7, the right side pressure load FR is greater than the left side pressure load FL.

In the mask pressure body 50 of the present embodiment, the buffer members 30 are deformable. During the transition from the state of FIG. 6 to the state of FIG. 7, the right side pressure load FR is gradually reduced, but the right side pressure load FR is always greater than the left side pressure load FL. Naturally, the left side and right side buffer members 30 are also deformed in accordance with the magnitude of the pressure load. Accordingly, the deformation amount of the right side buffer member 30 is greater than that of the left side buffer member 30. A deformation amount difference S1 is a difference in deformation amount between right and left. Thus, the parallelism (actual value) between a pair of the pressure planes P4 and P50 during the pressure process in FIG. 7 is smaller than that (initial value) at the start of the pressure process in FIG. 6 due to the deformation of the buffer members 30.

In FIG. 7, since the parallelism between a pair of the pressure planes P4 and P50 is not zero, a difference in deformation amount also occurs between the right side and left side of the adhesive layer 90. However, the parallelism between a pair of the pressure planes P4 and P50 is small, and therefore, the difference in deformation amount between the right side and left side of the adhesive layer 90 is also small. Hence, when the mask pressure body 50 of the present embodiment is used, the nonuniformity in deformation amount of the adhesive layer 90 in the plane direction can be reduced as compared with a case in which the conventional mask pressure body having no buffer member 30 is used.

Moreover, the compressive elastic modulus (the degree of hardness or softness) and thickness of each buffer member 30 are appropriately changed, thereby enabling a change in the deformation amount of each buffer member 30. In particular, the deformation amount of each buffer member 30 is increased, thereby enabling a reduction in the deformation amount of the adhesive layer 90. In other words, an unbalanced pressure load is further absorbed by the buffer members 30, thus enabling a decrease in the influence of the unbalanced pressure load exerted on the adhesive layer 90.

The second use example represents a case in which the pressure pins 40 are located partially uniformly within the opening 16 as illustrated in FIG. 8. Based on results obtained by applying the first use example to the pellicle mounting apparatus 1, a worker can grasp the tendency of unbalanced pressure load in the pellicle mounting apparatus 1. Specifically, using a detector capable of detecting a pressure load, a pressure load applied to each region in the plane direction of the adhesive layer 90 is measured, thus grasping the tendency of an unbalanced pressure load. Therefore, in the second use example, the pressure pins 40 are located so as to be able to cope with nonuniformity of pressure loads.

In FIG. 8, the seven pressure pins 40 are located. The three pressure pins 40 are located at each of the center and the left side, but only the two pressure pins 40 are located at the right side. Therefore, when a pressure load, which is laterally uniform, is applied to the mask pressure body 50, the deformation amount of the right side buffer member 30 is greater than that of the left side buffer member 30. In other words, the pressure plane P50 of the second use example is likely to rise rightward compared with the pressure plane P50 of the first use example.

FIG. 9 is a front cross-sectional view when the mask pressure body 50 is viewed after the start of a pressure process. FIG. 9 is associated with FIG. 7. In FIG. 9, a deformation amount difference S2 is a difference in deformation amount at the left side. The deformation amount difference S2 of the second use example is greater than the deformation amount difference S1 of the first use example. This is because the number of the right side pressure pins 40 is smaller than that of the left side pressure pins 40 in the second use example. In this case, the contact area between the pressure pins 40 and the buffer members 30 is changed in accordance with the number of the pressure pins 40. In the second use example, the contact area at the right side is ⅔ of the contact area at the left side. The smaller the contact area, the greater the pressure load applied to the buffer member 30 per unit area. In other words, a portion of the right side buffer member 30, coming into contact with the pressure pins 40, is deformed more easily than a portion of the left side buffer member 30, coming into contact with the pressure pins 40. Accordingly, the right side pressure pins 40 are moved in the pressure direction D more easily than the left side pressure pins 40. As a result, the parallelism between a pair of the pressure planes P4 and P50 can be reduced to a greater extent than the first use example. Hence, the deformation amount difference between the right side and left side of the adhesive layer 90 can be reduced to a greater extent than the first use example.

Based on results obtained in the first use example, a worker can decide locations in the second use example. In the first use example, the pressure pins 40 are located uniformly in the plane direction of the pressure plane P50. If the deformation amount of the adhesive layer 90 is unbalanced in the plane direction as a result of the pressure process, it is evident that the parallelism between a pair of the pressure bodies P4 and P50 is not zero. In such a case, the worker changes the locations of the pressure pins 40 so as to reduce the unbalance. Thus, the parallelism between a pair of the pressure planes P4 and P50 can be brought close to zero.

With the use of the mask pressure body 50 having the above-described structure, the buffer members 30 are deformed in accordance with the pressure load exerted between a pair of the pressure bodies P4 and P50; therefore, the parallelism (actual value) during the pressure process can be smaller than the parallelism (initial value) resulting from the machining accuracy and assembly accuracy. As a consequence, the pressure load applied to the adhesive layer 90 can be brought close to uniformity in the plane direction.

Moreover, in accordance with the unbalanced pressure load in the plane direction of the mask pressure plane P50, the number and positions of the pressure pins 40 located within the mask pressure body 50 are appropriately adjusted, thereby enabling a further reduction in the parallelism (actual value) during the pressure process.

The mask pressure body 50 includes the cap pins 60. Therefore, even if dust is generated from the buffer members 30, the dust can be prevented from being discharged through the opening 16 to outside.

Inner surfaces of the through holes 16a, outer surfaces of the pressure pins 40 and outer surfaces of the cap pins 60 are each tapered. Therefore, when the pressure pins 40 and the cap pins 60 are moved in the pressure direction D, the pressure pins 40 and the cap pins 60 do not come into friction contact with the through holes 16a. Accordingly, even if the pressure pins 40 and the cap pins 60 are moved in the pressure direction D, generation of dust is prevented.

For the locations of the pressure pins 40, the following variation may be applied to the mask pressure body 50.

The opening 16 is set so as to coincide with the backside portion corresponding to the immediate back of the pellicle frame 82, or the outside portion located outside of the backside portion. The above-described first and second use examples each represent the case where both of the backside portion and the outside portion are pressurized.

Figure 10:
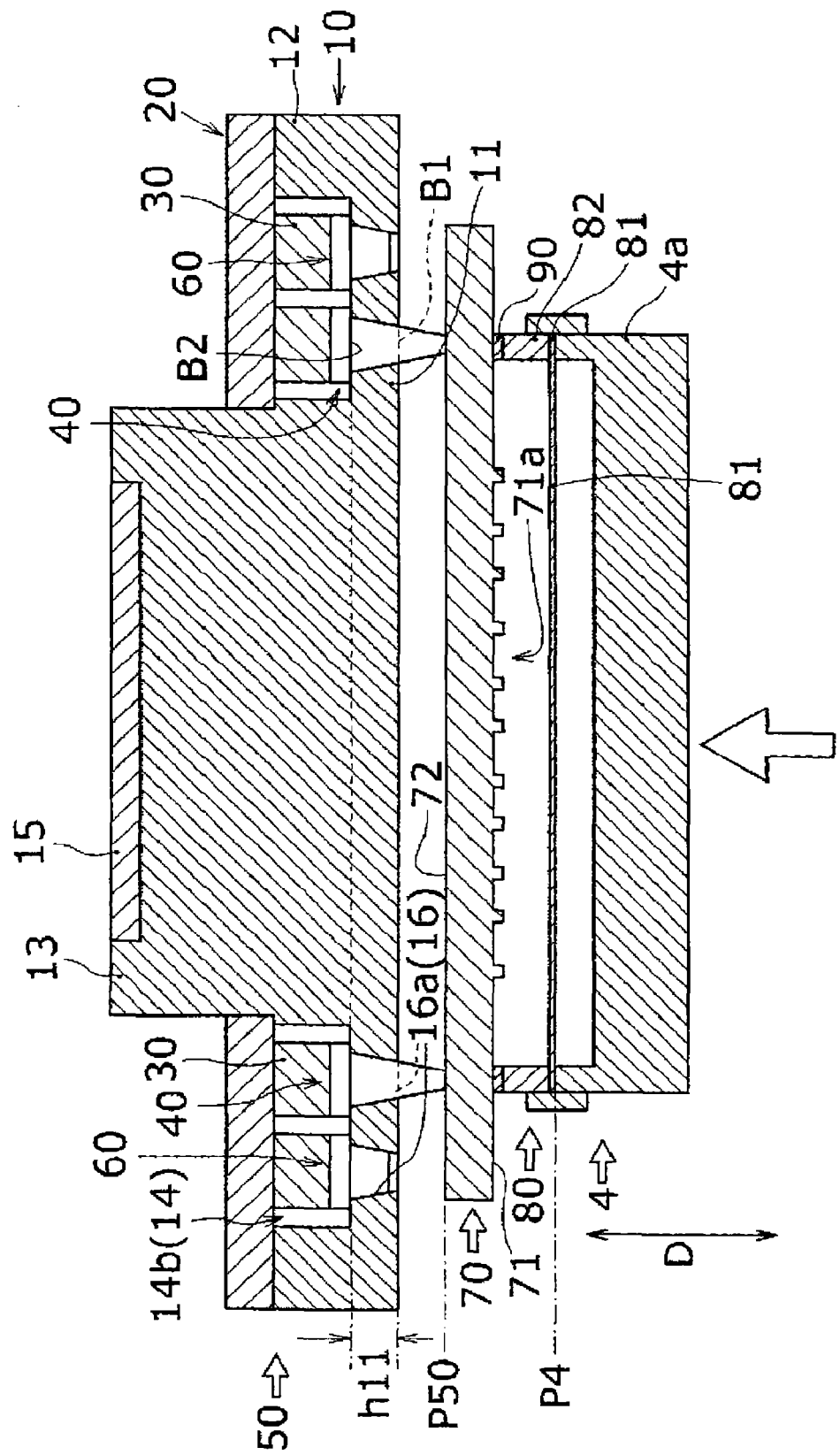
FIG. 10 shows a cross-sectional view taken along the line B-B of FIG. 2 (third use example).

FIG. 10 illustrates the mask pressure body 50 according to a third use example. In FIG. 10, the pressure pins 40 are located in the opening 16 so that the pressure pins 40 pressurize only the backside portion. In other words, the pressure pins 40 are located in the through holes 16a in the single inner row within each second side portion 14b. In such a case, the generation of a strain in the photomask 70 in a pressure process can be further reduced.

The number of the pressure pins 40 located within the mask pressure body 50 is three at the minimum. If there are three pressure pins 40, the mask pressure body 50 can pressurize the photomask 70. By making reference to results of a pressure process, a worker is allowed to change the number of the pressure pins 40 to four or more, and to appropriately set the positions of the pressure pins 40. Thus, the worker can bring the parallelism between a pair of the pressure planes P4 and P50 to zero infinitely.

(Other Embodiments)

The following varied structures may be applied to the mask pressure body 50.

Each pressure pin 40 is an example of a contact member constituting the mask pressure plane P50. Further, each cap pin 60 is an example of a cover member for closing off the opening 16. It is only necessary that the contact member and cover member each have a shape which will not fall off from the opening 16, and the contact member and cover member are not limited to pins (shaft members). The contact member and cover member may be spherical in shape, for example.

In the present embodiment, the opening 16 is formed into a rectangular shape in plan view so as to correspond to the pellicle frame 82. However, the present invention is not limited to this structure. It is only necessary to set the position of the opening 16 so that the pressure pins 40 can support the photomask 70 at least at three points. Therefore, all of the through holes 16a will never be located on the same straight line.

The pressure pins 40 have hardness that will not cause deformation resulting from a pressure load applied in a pressure process. Therefore, after the pressure pins 40 have been brought into contact with the glass surface 72 of the photomask 70, a contact mark (touch mark) is unlikely to remain on the glass surface 72. Accordingly, the glass surface 72 is unlikely to be contaminated by the pressure pins 40. As materials for the pressure pins 40, engineering plastics such as PEEK (registered trademark), VESPEL (registered trademark) and PBI (polybenzimidazole), for example, can be utilized.

Figure 11:
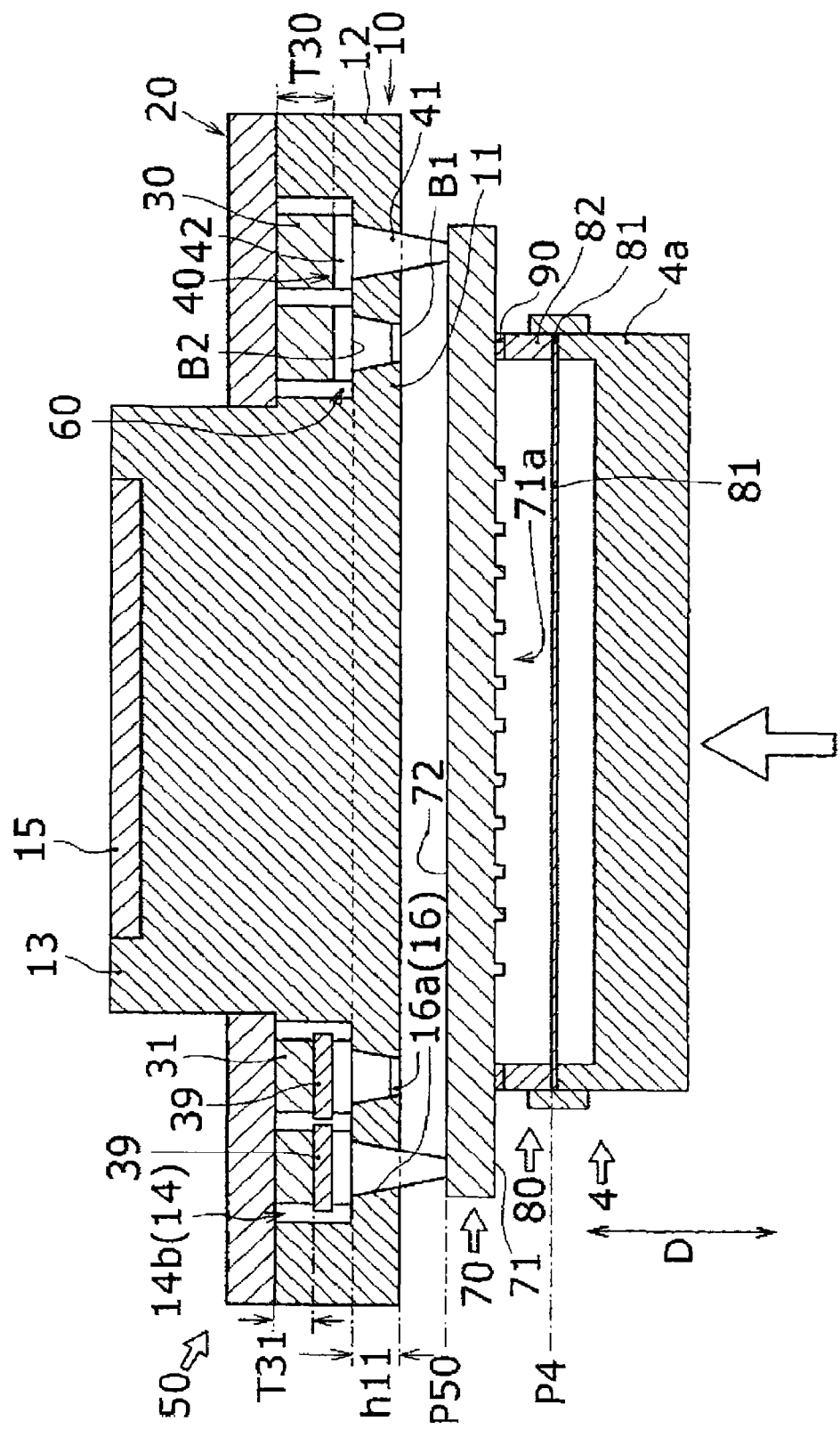
FIG. 11 shows a front cross-sectional view of a mask pressure body (second embodiment).

FIG. 11 is a cross-sectional view (front cross-sectional view) taken along the line A-A of FIG. 2 according to a second embodiment. In FIG. 11, the left side portion of the groove 14 (second side portion 14b) is provided with a buffer member 31 and a floor plate 39. The total thickness of the buffer member 31 and floor plate 39 in the pressure direction D is equal to a thickness T30 of the buffer member 30. In other words, a thickness T31 of the buffer member 31 is smaller than the thickness T30 of the buffer member 30.

Therefore, when identical pressure loads are applied to the left side buffer member 31 and right side buffer member 30, the deformation amount of the left side buffer member 31 is smaller than the deformation amount of the right side buffer member 30. Accordingly, with the use of the buffer members 30 and 31 having different thicknesses, the deformation amounts of the buffer members 30 and 31 in the pressure direction can be changed at each different location of the buffer members 30 and 31.

Also when the buffer members 30 and 31 formed of different materials are used instead of the buffer members having different thicknesses, the deformation amounts of the buffer members in the pressure direction can be changed at each different location of the buffer members.

It should be noted that in order to cope with, for example, changes in pressure loads and/or the adhesive layer 90, the thicknesses and/or materials of all the buffer members 30 located within the pressure body 50 may be changed.

In the present embodiment, the dimensions of the buffer members 30 are set so that the single buffer member 30 is associated with a plurality of the through holes 16a. Instead of this structure, for example, the buffer member 30 having a size corresponding to that of the bottom portion 42 may be fixed to each pressure pin 40. In other words, as long as the area of a region of each buffer member 30, which receives a pressure load, is increased in accordance with the number of the pressure pins 40, other structures may be applied.

Furthermore, in FIG. 11, the floor plates 39 are used in order to compensate for a difference in thickness between the buffer members 30 and 31. Instead of the floor plates 39, the pressure pins 40 and cap pins 60 having different axial lengths may be used. In other words, it is only necessary that the distance between the lower surface of the cover body 20 and the mask pressure plane P50 is constant. It is only necessary that the total lengths of the pressure pins 40 (cap pins 60), buffer members and floor plates in the pressure direction D are equal with respect to the plane direction of the pressure plane P50.

Figure 12:
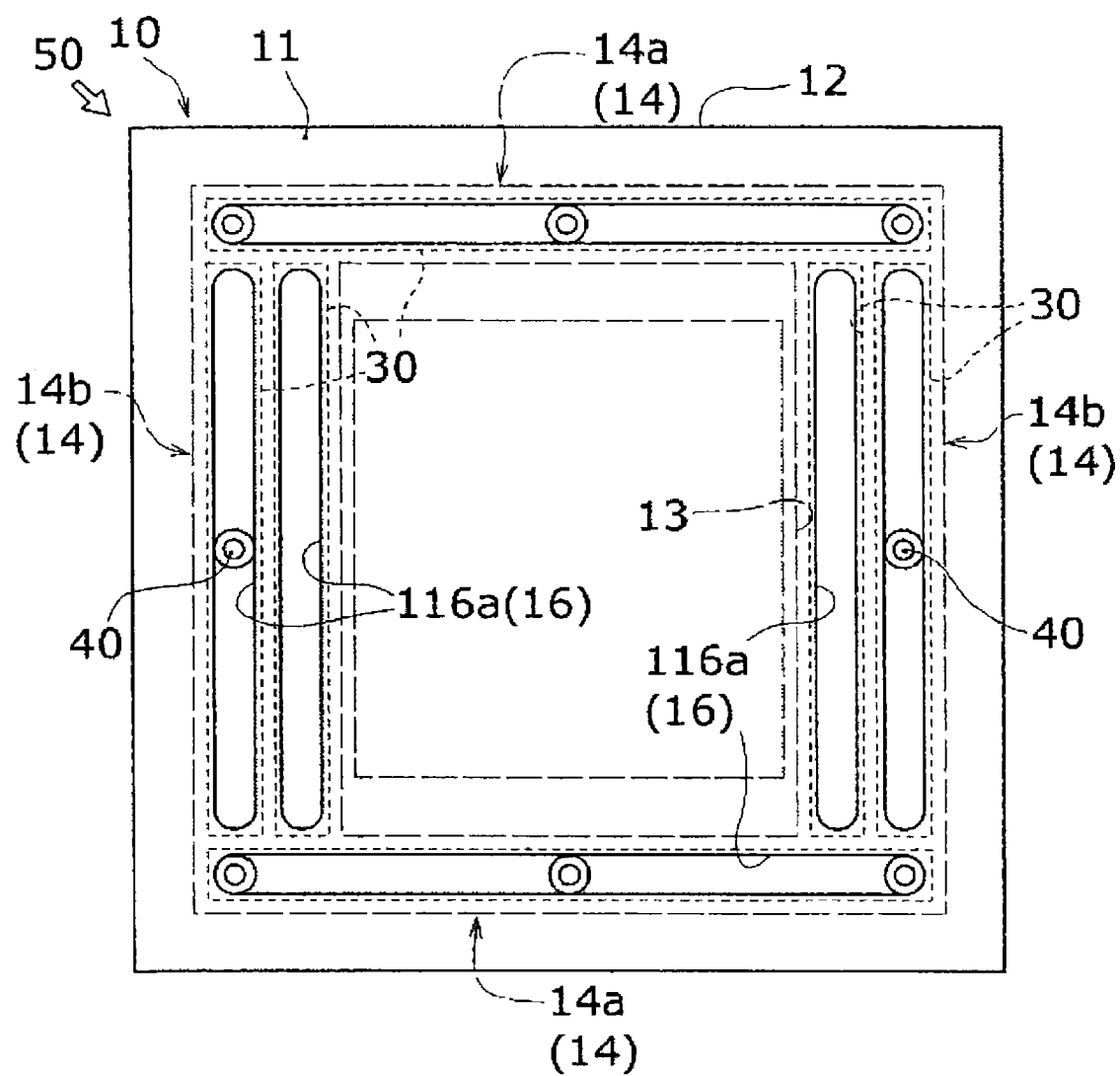
FIG. 12 shows a bottom view of a mask pressure body viewed from the bottom side thereof (third embodiment).
Figure 13:
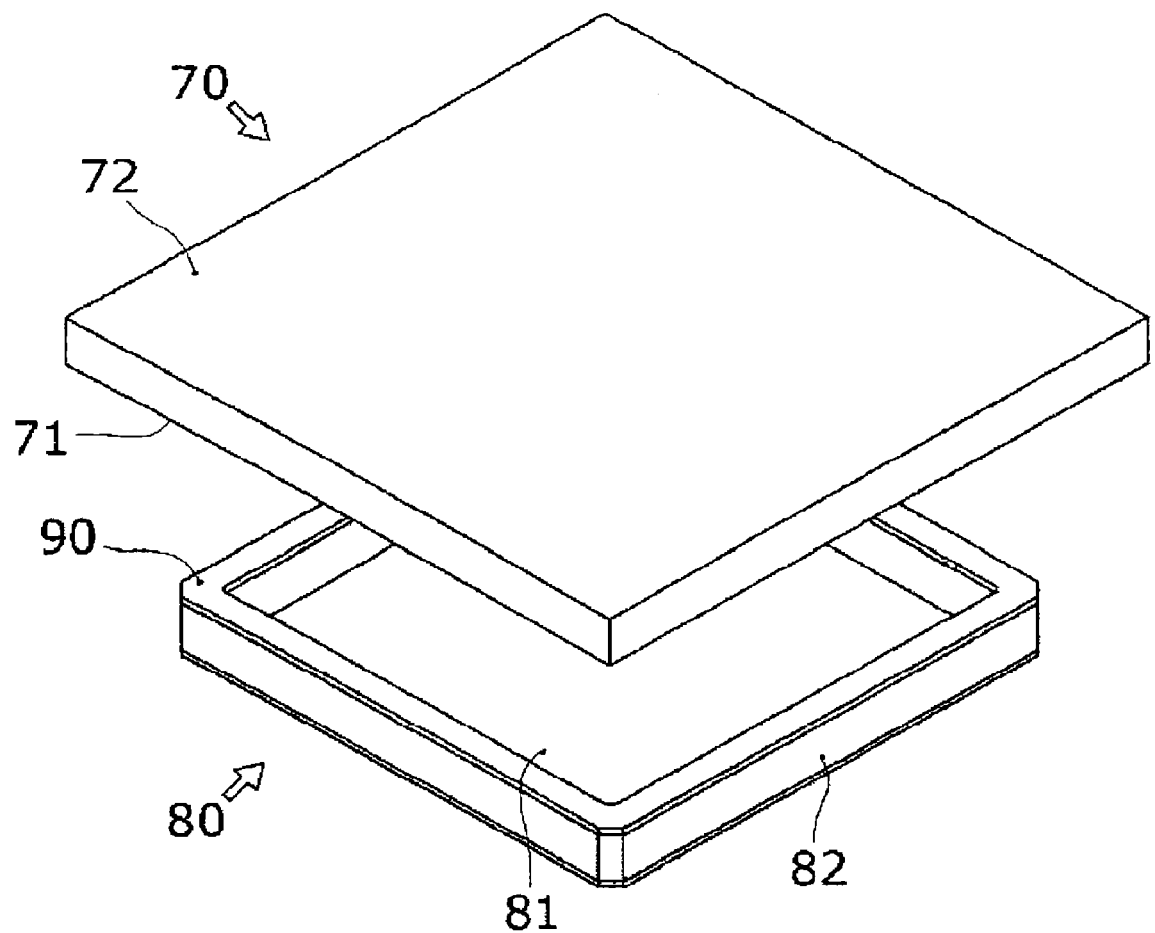
FIG. 13 shows a perspective view illustrating a photomask and a pellicle assembly.
Figure 14:
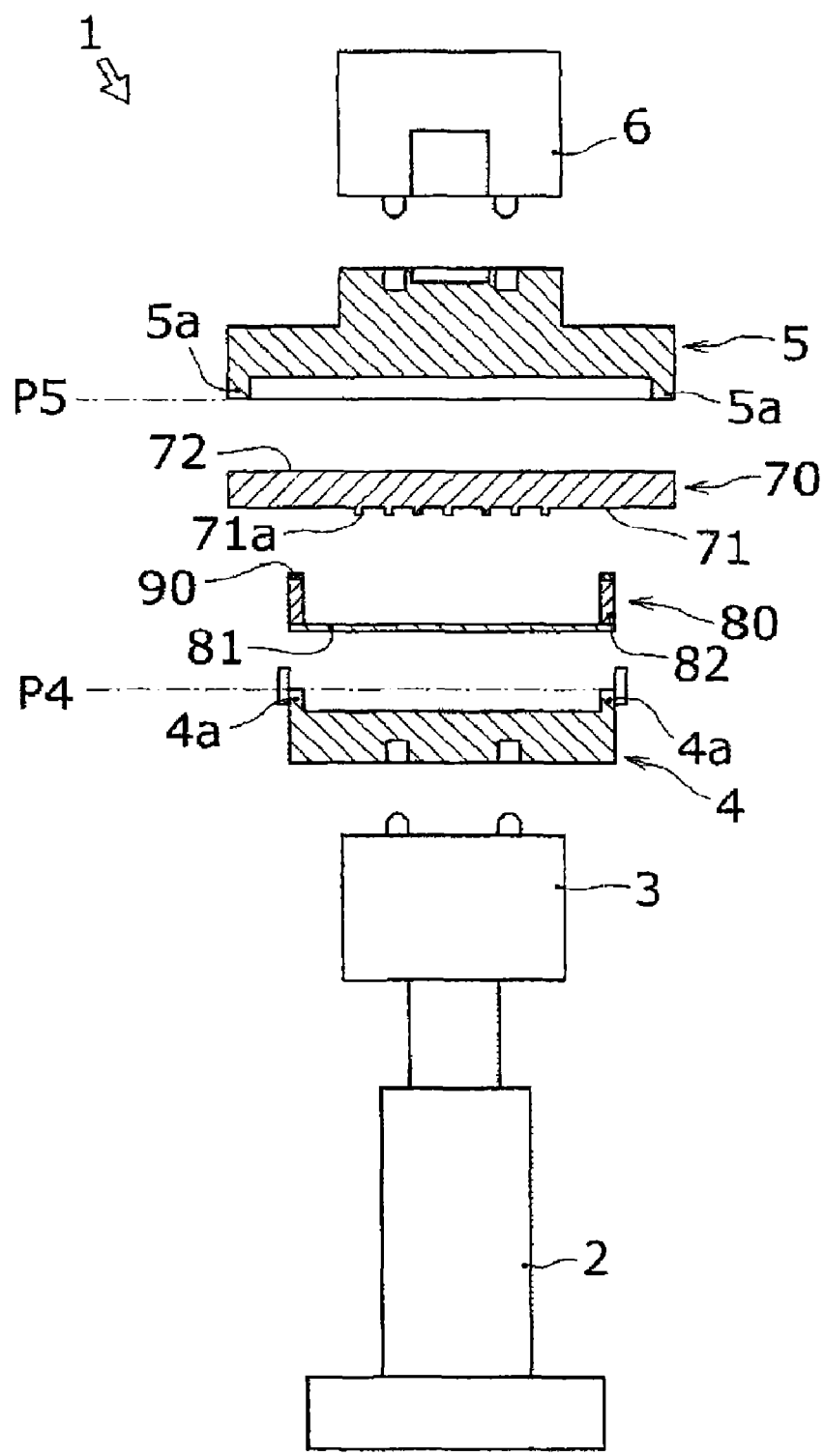
FIG. 14 shows a front view illustrating principal parts of a conventional pellicle mounting apparatus.

FIG. 12 is a bottom view of the mask pressure body viewed from the bottom side thereof according to a third embodiment. In FIG. 12, the opening 16 is formed by elongated holes 116a instead of the through holes 16a. Also in the opening 16 formed by the elongated holes 116a, the positions of the pressure pins 40 can be changed. The opening 16 is formed by a set of the three or more elongated holes 116a so that the mask pressure body 50 can support the photomask 70 at three points.

The above description illustrates examples in which the pressure body of the present invention, including the pressure pins 40 and the buffer members 30, is applied to the mask pressure body 50. However, the pressure body of the present invention may also be applied to the pellicle pressure body 4. Moreover, the pressure body of the present invention may also be applied to both of a pair of the pressure bodies 4 and 50.

EXPLANATION OF LETTERS OR NUMERALS 1 pellicle mounting apparatus
2 lower air cylinder (actuator)
10 main body
16 opening
16a through hole
20 cover body
30 buffer member
40 pressure pin (contact member)
60 cap pin (cover member)
70 photomask
80 pellicle assembly
81 pellicle film
D pressure direction
P4 pellicle pressure plane
P50 mask pressure plane

The invention claimed is:

1. A pressure body for pressurizing a photomask and a pellicle assembly along a given pressure direction, the pellicle assembly comprising a pellicle film and a pellicle frame for supporting the pellicle film, the pressure body comprising:
three or more contact members that come into contact with the photomask or the pellicle assembly at one side of the pressure direction;
a main body provided with an opening, the opening supporting the contact members so as to prevent the contact members from dropping off to said one side, the opening being able to change positions within a plane perpendicular to the pressure direction, the contact members being supported at said positions;
a cover body fixed to the main body at the other side of the pressure direction; and
a buffer member located between the contact members and the cover body in the pressure direction.

2. The pressure body according to claim 1,
further comprising a cover member, the cover member supported by the opening so as to be prevented from dropping off to said one side, the cover member located in alignment with the contact members so as to close off the opening, thereby preventing the buffer member from being exposed to said one side.

3. The pressure body according to claim 2,
wherein the opening is a set of four or more through holes.

4. The pressure body according to claim 3,
further comprising a plurality of the cover members,
wherein one of the contact members and one of the cover members each have dimensions which can close off one of the through holes.

5. The pressure body according to claim 4,
wherein inner surfaces of the through holes are tapered, and
wherein the contact members and the cover members have tapered outer surfaces corresponding to the inner surfaces of the through holes.

6. The pressure body according to claim 1,
further comprising a plurality of the buffer members,
wherein the respective buffer members are located at different positions along the plane.

7. The pressure body according to claim 6,
wherein materials for the buffer members are different depending on the positions.

8. The pressure body according to claim 6,
wherein thicknesses of the buffer members in the pressure direction are different depending on the positions.

9. A pellicle mounting apparatus comprising:
a pair of pressure bodies for pressurizing a photomask and a pellicle assembly along a given pressure direction, the pellicle assembly comprising a pellicle film and a pellicle frame for supporting the pellicle film; and
an actuator capable of urging at least one of the pair of pressure bodies along the pressure direction,
wherein at least one of the pair of pressure bodies is the pressure body according to claim 1.

* * * * *